United States Patent
Pocas et al.

(10) Patent No.: US 8,975,156 B2
(45) Date of Patent: Mar. 10, 2015

(54) METHOD OF SEALING TWO PLATES WITH THE FORMATION OF AN OHMIC CONTACT THEREBETWEEN

(75) Inventors: Stephane Pocas, Grenoble (FR); Hubert Moriceau, Saint Egreve (FR); Jean-Francois Michaud, St Pierre de Soucy (FR)

(73) Assignee: Commissariat a l'Energie Atomique, Paris (FR)

( * ) Notice: Subject to any disclaimer, the term of this patent is extended or adjusted under 35 U.S.C. 154(b) by 1282 days.

(21) Appl. No.: 10/584,052

(22) PCT Filed: Dec. 21, 2004

(86) PCT No.: PCT/FR2004/050742
§ 371 (c)(1),
(2), (4) Date: Jun. 22, 2006

(87) PCT Pub. No.: WO2005/064657
PCT Pub. Date: Jul. 14, 2005

(65) Prior Publication Data
US 2007/0072391 A1    Mar. 29, 2007

(30) Foreign Application Priority Data
Dec. 23, 2003 (FR) ...................... 03 51190

(51) Int. Cl.
- *H01L 21/00* (2006.01)
- *H01L 21/46* (2006.01)
- *H01L 21/18* (2006.01)
- *H01L 21/265* (2006.01)
- *H01L 21/266* (2006.01)

(52) U.S. Cl.
CPC ......... *H01L 21/187* (2013.01); *H01L 21/26506* (2013.01); *H01L 21/266* (2013.01)
USPC .................. 438/455; 257/341; 257/E21.162; 257/E21.168; 257/E21.054; 257/E21.087; 438/514; 438/518; 438/526; 438/530; 438/537; 438/552; 438/533

(58) Field of Classification Search
USPC ......... 438/455, 406, 459, 471, 473, 795, 977, 438/514, 518, 526, 530, 533, 537, 552; 257/341, E21.161, E21.168, E21.054, 257/E21.087
See application file for complete search history.

(56) References Cited

U.S. PATENT DOCUMENTS

| 4,181,538 A | * | 1/1980 | Narayan et al. ............... 438/473 |
| 4,577,396 A | * | 3/1986 | Yamamoto et al. ........... 438/582 |

(Continued)

FOREIGN PATENT DOCUMENTS

| DE | 38 29 906 | 3/1990 |
| DE | 43 04 349 | 8/1994 |

(Continued)

OTHER PUBLICATIONS

Sze et al, Physics of Semiconductor Devices 1st Ed. 1969, 2nd Ed. 1981, 3rd Ed. 2007, Sec. 3.6, pp. 187-191.*

(Continued)

*Primary Examiner* — Thao X Le
*Assistant Examiner* — Eric Jones
(74) *Attorney, Agent, or Firm* — Oblon, Spivak, McClelland, Maier & Neustadt, L.L.P.

(57) ABSTRACT

A method of sealing a first wafer and a second wafer each made of semiconducting materials, including: implanting a metallic species in at least the first wafer, assembling the first wafer and the second wafer by molecular bonding, and after the molecular bonding, forming a metallic ohmic contact including alloys formed between the implanted metallic species and the semiconducting materials of the first wafer and the second wafer, the metallic ohmic contact being formed at an assembly interface between the first wafer and the second wafer, wherein the forming includes causing the implanted metallic species to diffuse towards the interface between the first wafer with the second wafer and beyond the interface.

31 Claims, 5 Drawing Sheets

(56) References Cited

U.S. PATENT DOCUMENTS

| | | | |
|---|---|---|---|
| 4,742,017 A * | 5/1988 | Bredthauer | 438/72 |
| 5,236,872 A * | 8/1993 | van Ommen et al. | 438/659 |
| 5,354,697 A * | 10/1994 | Oostra et al. | 438/514 |
| 5,374,564 A | 12/1994 | Bruel | |
| 5,528,058 A * | 6/1996 | Pike et al. | 257/142 |
| 5,654,241 A * | 8/1997 | Kakumu | 438/306 |
| 5,783,477 A * | 7/1998 | Kish et al. | 438/455 |
| 5,880,010 A | 3/1999 | Davison | |
| 6,054,369 A * | 4/2000 | Neilson et al. | 438/455 |
| 6,097,096 A | 8/2000 | Gardner et al. | |
| 6,242,324 B1 | 6/2001 | Kub et al. | |
| 6,274,892 B1 * | 8/2001 | Kub et al. | 257/131 |
| 6,281,039 B1 | 8/2001 | Marion | |
| 6,340,812 B1 | 1/2002 | Izumi et al. | |
| 6,410,371 B1 * | 6/2002 | Yu et al. | 438/151 |
| 6,465,892 B1 | 10/2002 | Suga | |
| 6,809,008 B1 | 10/2004 | Holm et al. | |
| 6,809,358 B2 | 10/2004 | Hsieh et al. | |
| 6,902,987 B1 | 6/2005 | Tong et al. | |
| 7,208,392 B1 | 4/2007 | Jaussaud et al. | |
| 7,452,745 B2 | 11/2008 | Dupont et al. | |
| 2002/0157790 A1 * | 10/2002 | Abe et al. | 156/334 |
| 2002/0164839 A1 | 11/2002 | Enquist | |
| 2002/0173118 A1 | 11/2002 | Dietrich et al. | |
| 2003/0057522 A1 * | 3/2003 | Francis et al. | 257/566 |
| 2003/0129780 A1 | 7/2003 | Auberton-Herve | |
| 2004/0014299 A1 | 1/2004 | Moriceau et al. | |
| 2004/0097008 A1 | 5/2004 | Leedy | |
| 2005/0020029 A1 | 1/2005 | Danel | |
| 2005/0104089 A1 | 5/2005 | Engelmann et al. | |
| 2008/0041517 A1 | 2/2008 | Moriceau et al. | |
| 2008/0296712 A1 | 12/2008 | Feuillet et al. | |

FOREIGN PATENT DOCUMENTS

| | | |
|---|---|---|
| FR | 2 783 969 | 3/2000 |
| FR | 2 816 445 | 5/2002 |
| FR | WO/03/028101 | 4/2003 |
| JP | 1-199469 | 8/1989 |
| JP | 2-170528 | 7/1990 |
| JP | 7-221023 | 8/1995 |
| JP | 10-223552 | 8/1998 |
| JP | 11-103034 | 4/1999 |
| JP | 2002-507058 | 3/2002 |
| WO | WO/01/18853 A1 | 3/2001 |

OTHER PUBLICATIONS

Sze et al, Physics of Semiconductor Devices 1st Ed. 1969, 2nd Ed. 1981, 3rd Ed. 2007, Sec. 3.6, pp. 187-191.*

Zhu, Shiyang et al.,"Buried Cobalt Silicide Layer Under Thin Silicon Film Fabricated by Wafer Bonding and Hydrogen-Induced Delamination Techniques", Journal of the Electrochemical Society, vol. 146. No. 7, pp. 2712-2716, 1999.

Haisma, Jan,"Contact Bonding, Including Direct-Bonding in a Historical and Recent Context of Materials Science and Technology, Physics and Chemistry Historical Review in a Broader Scope and Comparative Outlook", Materials Science and Engineering, vol. 37, pp. 1-58, 2002.

Xiao, Zhi-Xiong et al.,"Low Temperature Silicon Wafer-to-Wafer Bonding with Nickel Silicide", J. Electrochem. Soc., vol. 145, No. 4, pp. 1360-1362, 1998.

Moriceau, H. et al.,"The Bonding Energy Control: an Original Way to Debondable Substrates", Electrochemical Society Conf., vol. 19, 2003.

Nicolet, Marc-A et al.,"Silicides", VLSI Handbook, pp. 415-432, 1985.

Tong-Goesele,"Semiconductor Wafer Bonding", The Electrochemical Society Series, pp. VII-XVIII, 1-15, 49-135, 1998.

Iyer, S.S. et al.,"Silicon Wafer Bonding Technology for VLSI and MEMS Applications", INSPEC, pp. V-XXV, 1-51, 123-143, 2002.

Sakaguchi, K. et al.,"Eltran by Splitting Porous Si Layers", Electrochemical Society Proceedings, vol. 99-3, pp. 116-121, 1999.

Auberton-Nerve, A.J.,"Why Can Smart Cut Change the Future of Microelectronics?", International Journal of High Speed Electronics and Systems, vol. 10, No. 1, pp. 131-146, 2000.

Hartmut Bracht, "Diffusion Mechanisms and Intrinsic Point-Defect Properties in Silicon", www.mrs.org/publications/bulletin, MRS Bulletin/Jun. 2000, pp. 22-27.

Q.-Y. Tong, et al., "Semiconductor Wafer Bonding: Science and Technology", John Wiley & Sons, Inc., XP008042464, pp. 215-219, 1999.

Goran Thungstrom, et al., "Contacts to Monocrystalline N- and P-Type Cillicon by Wafer Bonding Using Cobalt Disilicide", Physica Scripta, vol. T54, 1994, pp. 77-80.

Ismail, M.S., et al., "Platinum Silicide Fusion Bonding", Electronics Letters, Vo. 27, No. 13, pp. 1153-1155, 1991.

Ploessl, A., et al., "Wafer Direct Bonding: Tailoring Adhesion Between Brittle Materials", Materials Science and Engineering, vol. 25, No. 1-2, pp. 1-88, 1999.

Shigetou, A., et al., "Room Temperature Bonding of Ultra-Fine Pitch and Low-Profiled Cu Electrodes for Bump-Less Interconnect", Electronic Components and Technology Conference, vol. 53, pp. 848-852, 2003.

Ljungberg, K., et al., "Buried Cobalt Silicide Layers in Silicon Created by Wafer Bonding", Journal of the Electrochemical Society, vol. 141, No. 10, pp. 2829-2833, 1994.

B. Aspar, et al., "Smart-Cut Process Using Metallic Bonding: Application to Transfer of Si, GaAs, InP Thin Films", Electronics Letters, vol. 35, No. 12, Jun. 10, 1999, pp. 1024-1025.

Japanese Office Action mailed on Aug. 16, 2011 for JP 2006-546283 (with partial English Translation).

* cited by examiner

METHOD OF SEALING TWO PLATES WITH THE FORMATION OF AN OHMIC CONTACT THEREBETWEEN

TECHNICAL DOMAIN AND PRIOR ART

The invention relates to a sealing process for two wafers made of semiconducting materials, for example made of silicon, with the formation of a pure resistive contact between the two wafers.

In the literature, two wafers are sealed with the formation of a pure resistive contact by depositing a metallic layer, for example as described in the document by J. Haisma entitled <<Contact Bonding, Including Direct-Bonding in a Historical and Recent Context of Materials Science and Technology, Physics and Chemistry>>, Materials Science and Engineering, 37, 2002, p. 1-60. Other options include eutectic sealing, together with brazing or the formation of a silicide through a layer of deposited metal as described in the article by Z. X. Xiao et al. entitled <<Low Temperature Silicon Wafer to Wafer Bonding with Nickel Silicide, Journal of the Electrochemical Society, 145, 1998, p. 1360-1362.

All these techniques require the prior deposition of a metallic layer. It is not easy to bond a metallic layer to a semiconducting support and particular technological steps are necessary that make sealing more complex. Surface preparation of this metallic layer is also necessary (particularly its surface chemistry and roughness).

Therefore, the problem arises of finding a new sealing process for wafers of semiconducting materials and particularly silicon wafers, that eliminate all these additional technological steps, and particularly avoiding the deposition of a metallic layer.

PRESENTATION OF THE INVENTION

The process according to the invention comprises a step for implantation of metallic species in at least one first substrate, an assembly step with a second substrate by molecular bonding, and an annealing step or the formation of a conducting or a metallic compound(s) between the implanted metallic species and the material(s) from which the substrates are composed or resulting from these implanted species and this or these materials.

A conducting compound can be formed from annealing or a heat treatment at a temperature equal to at least the temperature at which the compound(s) is (are) formed.

Semiconducting wafers, for example silicon wafers, are preferably implanted by metallic species at a very shallow depth (a few nanometers) and at a dose of between a few $10^{14}$ and a few $10^{18}$ species/cm$^2$ or $10^{19}$ species/cm$^2$.

The implantation depth can be reduced by making the implantation through a surface layer formed on the substrate to be implanted, or to thin the implanted substrate after implantation.

The implantation can be positioned through a mask.

After implantation, the surface of the wafer is assembled onto another wafer by molecular bonding.

The structure obtained is annealed, preferably at the formation temperature of a conducting compound between the implanted metal and the material(s) at the surface of the two substrates to be assembled. Since the implanted zone is sufficiently close to the surface, formation of this (these) conducting compound(s) will then be induced and molecular bonding will be modified by the presence of this (these) conducting compound(s).

The bonded materials may be silicon or semiconducting materials other than silicon, provided that the implanted species forms a conducting compound with the surface material(s) of the substrates to be assembled, during the subsequent heat treatment. In particular, the semiconducting material may be one of the Si, GaAs, SiC, InP, Ge, SiGe . . . materials. The two bonded materials may be of different nature.

If there is any implantation in the two wafers, the implanted species may be different for the two wafers, the implantation conditions may be different on different wafers.

The implantation may be done using different species in the same wafer, with implantation conditions that may be different for different species.

The compound obtained for the pure resistive contact may be of the refractory type, which is advantageous particularly for subsequent processes to be performed at high temperature (for example growth by epitaxy).

One of the substrates may be thinned after bonding and before or after annealing, using one of the following conventional techniques or a combination of these techniques: burn-in or grinding, polishing, chemical etching, ionic etching, etc.

One of the implanted substrates may be a heterostructure, or an assembly of at least two structures comprising two different materials, for example of the SOI (Silicon on insulator) type. In particular, the surface layer may be composed of one of the above mentioned semiconducting materials. This heterostructure can be thinned after assembly and before or after annealing to leave only its surface layer on the other substrate (for example, the silicon surface layer for an SOI substrate). This surface layer may itself contain or cover a layer of circuit made before assembly.

The heterostructure may be thinned by conventional thinning techniques mentioned above. Advantageously, the heterostructure will include a buried or non-buried layer that is selective with regard to the chosen thinning process. For example, for SOI type heterostructures, the buried silicon oxide layer can act as a stop layer, for example for chemical etching. Other stop layers could be provided in the heterostructure, for example an SiGe layer or a doped silicon layer. For example, it would also be possible to benefit from selectivity to etching of glass with respect to silicon in a silicon on glass type heterostructure.

In another advantageous embodiment, the heterostructure will be <<debondable>> and will then be thinned by <<debonding>> of the said heterostructure. In particular, the <<debondable>> nature could be obtained by assembly of two substrates at a bonding interface for which the bonding energy is low. For example to obtain such an interface, it would be possible to perform molecular bonding between two surfaces with controlled roughness as described in the article by Hubert Moriceau et al. <<The Bonding Energy Control: an Original Way to Debondable Substrates>>.

One of the substrates may comprise a weakening layer or plane, for example obtained by the implantation of gaseous species or by prior formation of a buried porous layer. One of the two substrates that comprises this weakening layer can then be thinned, for example after assembly of these two substrates, for example by causing a fracture at the separation zone.

There are many advantages of the process according to the invention:

Firstly, the invention includes the possibility of creating a pure resistive contact with any metal that can be implanted in the substrate and forms a conducting compound with the materials of the substrates to be assembled.

Furthermore, the wafers may be bonded by molecular bonding, with the formation of a pure resistive contact without needing to control either the deposition of a metal layer (roughness, crystalline structure, bond of the deposit, etc.), nor the chemistry of its surface (cleaning, oxidation, etc.).

It would be possible to bond wafers with a pure resistive contact onto the entire interface, or to bond wafers with a pure resistive contact located in predefined zones, for example by masking during implantation or using a hybrid surface composed of insulating zones and conducting zones.

Finally, it is possible to reduce the thermal budget necessary to reinforce bonding between the two semiconducting substrates assembled by molecular bonding. For bonding of two substrates, for example made of silicon, by conventional molecular bonding, prior art includes a method of creating a strong bond by applying heat treatments on the assembled structure at temperatures of more than about 500° C., as described for example in the book by Tong-Gösele <<Semiconductor Wafer Bonding>>, 1998, The Electrochemical Society Series, John Wiley & Sons, Inc. In the case according to the invention, if at least one of the silicon substrates is implanted for example with Pd ions, bonding will be reinforced at the temperature at which $Pd_2Si$ is formed, in other words about 150° C. The result is thus strong bonding (Si/Si in the example) without the need for a heat treatment at high temperature.

The invention also relates to a structure composed of two substrates made of semiconducting materials assembled by molecular bonding and with local zones of metallic compounds at the assembly interface.

For example, the semiconducting materials may be chosen from among Si, GaAs, SiC, InP, SiGe.

At least one of the substrates may be a heterostructure.

The metallic compounds may be alloys made from semiconducting materials of substrates at the assembly interface and at least one metal chosen from among nickel, palladium, cobalt, platinum, tantalum, tungsten, titanium, copper, etc.

In one particular embodiment, at least one of the substrates is a thin film.

At least one of the substrates may comprise electronic and/or optical and/or mechanical components.

For example, one of the substrates is a thin silicon film comprising RF circuits, and the other substrate may be made of a high resistivity silicon.

DETAILED PRESENTATION OF EMBODIMENTS OF THE INVENTION

A first process according to the invention and variants of this process will be described with reference to FIGS. 1A-1C et 2A-3.

In a first step, atomic or ionic species 4 are implanted close to the surface (the top surface) 6, but under this surface, in at least one wafer 2 made of a semiconducting material, for example silicon.

Several techniques can be used for this purpose.

Figure 1A:
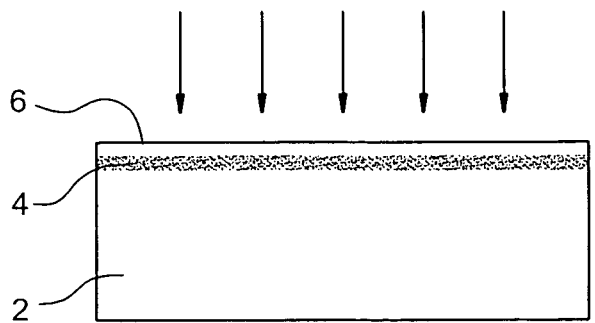
FIGS. 1A-3 show steps of various processes according to the invention.

According to a first technique, one or several metallic species 4 are implanted, for example nickel and/or palladium and/or titanium and/or cobalt and/or tantalum and/or platinum and/or tungsten and/or copper, etc., at a very low energy, directly in at least one of the substrates to be assembled, for example silicon: this is the case shown in FIG. 1A. The low energy used for the implantation assures a shallow average penetration depth Rp into the substrate 2, typically a few nm, for example between 5 nm and 10 nm.

According to another technique (FIG. 2A), the metallic ions mentioned above are implanted with a higher energy than before, therefore at a higher average depth Rp (for example between 10 nm and 20 nm) and the thickness of the silicon film separating the surface 6 from the implanted zone is reduced, for example by etching, or mechanically or by etching-mechanical attack, or by plasma etching, or by laser ablation, or by an ion beam, or by a combination of these techniques and/or techniques conventionally used in microelectronics. A thickness e is thus eliminated (FIG. 2B) which correspondingly reduces the depth of the implanted zone.

Figure 3:
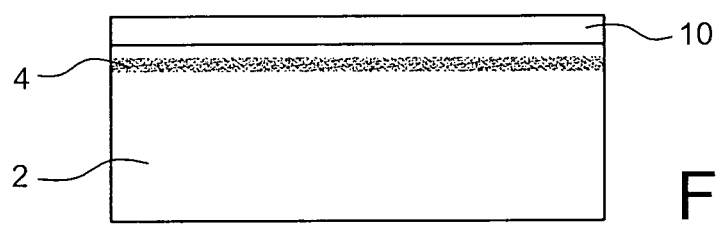

According to one variant (FIG. 3), an ionic or atomic implantation is performed through a thin sacrificial layer 10, for example silicon oxide that is eliminated after implantation, for example by etching in 1% HF (hydrofluoric acid). This limits the depth of the implanted zone in the substrate to be assembled.

The implantation may be ionic, using various plasma techniques, or implantation by withdrawal and/or Ion Beam Mixing. It may be done at a temperature other than ambient temperature.

A second step is the assembly step (FIG. 1B) to assemble the wafer or the substrate prepared according to one of the techniques described above, and a second wafer or a second substrate 12 made of a semiconducting material, for example also made of silicon. The surfaces of these wafers 2, 12 may be assembled by hydrophilic or hydrophobic bonding. Further information about these techniques can be obtained for example by referring to the book by Q.Y. Tong and U. Gosele <<Semiconductor Wafer Bonding>> (Science and Technology), Wiley Interscience Publications. Bonding is then done by molecular bonding.

For example, the surfaces can be made hydrophilic for silicon using a CARO type chemical cleaning (mix of $H_2So_4$ and $H_2O_2$, for example in the ratio of 2:1 at 140°) and SCI (mix of $NH_4OH:H_2O_2:H_2O$, for example in the ratio 1:1:5 at 70°), or hydrophobic by cleaning terminated by HF treatment (for example using 1% diluted hydrofluoric acid).

Furthermore, surface preparation techniques, for example such as plasma activation using capacitive coupling, for example reactive ionic etching <<RIE>> and inductive coupling (for example after glow type etching or chemical dry etching) can be used. These techniques are used firstly to thin the substrate to which they are applied as already describe above with reference to FIG. 2B, and/or secondly to activate species that are on the surface of the substrate. For example, the plasma may be activated with gases like oxygen, argon, nitrogen, hydrogen, $SF_6$, $CF_6$, $CF_4$, $CHF_3$, etc., alone or in combination.

Similarly, the mechano-chemical polishing technique that combines the advantages of thinning and preparation of wafer surfaces can be used.

For the third step (FIG. 1C), the structure is annealed after bonding, preferably at least at the temperature at which a conducting compound is formed resulting from the material of the substrates and the implanted metal, for example to form one of the silicides of the implanted metal if the two substrates to be assembled are made of silicon. This temperature may for example be of the order of 350° C. for nickel silicide (NiSi). This temperature depends on the metallic compound to be formed. Refer to reference tables like the reference table by A.

Nicollet and S. S Lau for metal silicide compounds (VLSI Handbook p. 422, 1985) to determine this temperature.

The implanted species will then diffuse and interact to form a conducting compound 20 close to the bonding interface 16 and therefore modify the bonding interface. This compound reinforces the assembly of the two substrates.

The second substrate (reference 12 in FIG. 1B) may be a substrate of the same nature as the substrate 2, or even a substrate or wafer identical to the substrate or the wafer 2. It may also be implanted with metallic ions or atoms, identical or different to those implanted in the substrate 2.

According to another embodiment, the substrate 12 and/or the substrate 2 may be heterostructures, for example of the SOI type.

Figure 7:
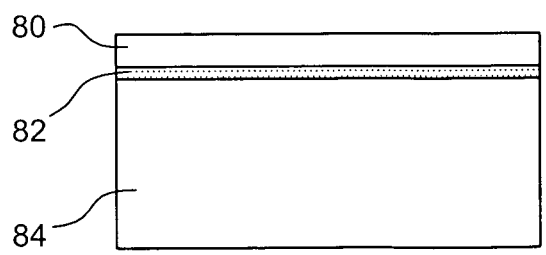
FIG. 7 shows an SOI substrate.

As illustrated in FIG. 7, an SOI (Silicon on Insulator) structure typically comprises a silicon layer 80 made on a buried layer 82 of silicon oxide that is itself supported on a silicon substrate 84, the silicon substrate acting as a mechanical support. Such structures are described, for example, in the book by S. S. Iyer et al. entitled <<Silicon Wafer Bonding Technology>>, INSPEC, 2002.

Typically, in the SOI example, the thickness of the layer 80 is between a few nanometers (for example 10 or 50 nm) and few hundred micrometers (for example 100 or 150 μm).

The insulation layer 82 may be between a few nanometers and a few tens of micrometers thick, for example 20 μm.

Figure 1B:
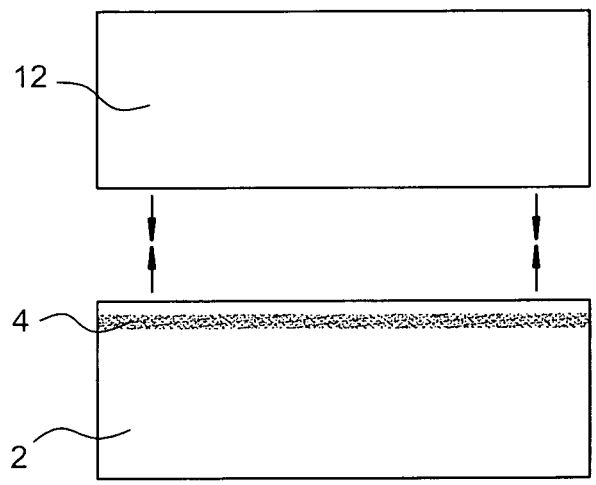
Figure 1C:
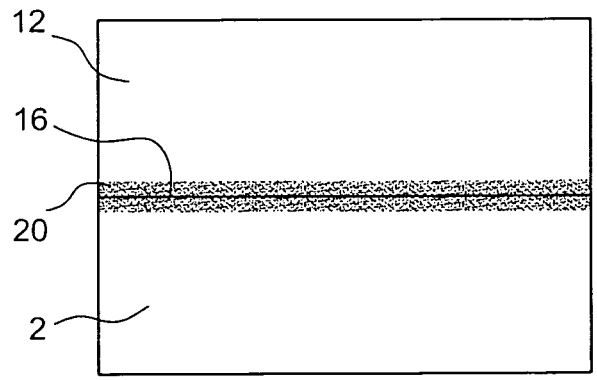

Such an SOI substrate can be assembled with an SOI or other substrate, at least one of these two substrates being implanted according to this invention, as illustrated in FIG. 1B: the SOI surface layer 80 is then assembled in contact with the upper face of the substrate 2.

SOME EXAMPLES ARE GIVEN BELOW

Example 1

Ni$^+$ ions are implanted in a silicon wafer 2 covered by a film 10 of silicon oxide (FIG. 3) with a thickness of 5 nm, at a dose of $2 \times 10^{17}$ ions/cm$^2$ and an energy of 10 keV. According to the SRIM-2000 simulation software, the implantation Rp is located at a depth of about 12 nm and about 7 nm from the silicon surface. After implantation, the silicon oxide 10 is withdrawn and a second wafer 12 made of implanted or non-implanted silicon (FIG. 1B) is bonded directly. A siliciding annealing is done at about 300° C. to form the Ni$_2$Si silicide 20, that will form up to and beyond the bonding interface 16 (FIG. 1C).

In one variant of this example, an intermediate layer (for example amorphous silicide) could be deposited on the implanted substrate after implantation. The thickness of this layer will be chosen to be compatible with the formation of the alloy at the bonding interface. If necessary, this intermediate layer could then be thinned before bonding. For example, this layer could be chosen to facilitate bonding by molecular bonding.

Example 2

Figure 2A:
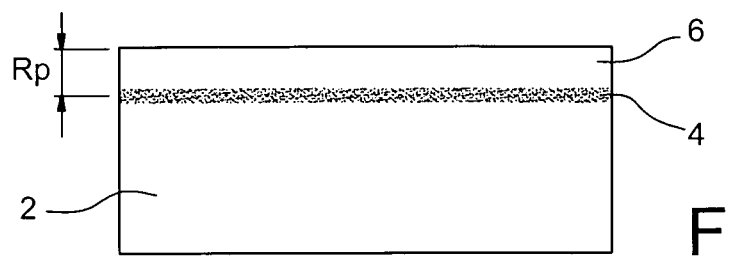

Ni+ ions are implanted directly in a silicon wafer 2 at a dose of $3 \times 10^{17}$ ions/cm$^2$ and at an energy of 10 keV (FIG. 2A). According to the SRIM-2000 simulation software, the implantation Rp is at a depth of about 13 nm. The silicon is etched to bring the implantation Rp close to the surface, for example with an SC1 type chemical solution (see above) until the implantation RP is close to the surface (FIG. 2B), for example at a depth of the order of 5 nm. A second wafer 12 made of silicon is then bonded directly (FIG. 1B). The next step is a siliciding annealing at about 300° C. so as to form an Ni$_2$Si silicide that will then be formed up to and beyond the bonding interface 16 (FIG. 1C).

A variant of this example consists of making all or part of the surface layer of the substrate 2 amorphous. Amorphisation of the material (in this case silicon) will facilitate diffusion of the implanted species in this material. If the amorphous material is present on the surface, diffusion to the interface will be facilitated. There are several possible techniques for making the surface part of the substrate 2 amorphous. A layer of amorphous material, for example amorphous silicon that can be thinned if necessary, can be deposited before and/or after implantation on the silicon substrate. The next step is to implant ions, for example Ni+ as in the previous example. The implantation may take place in the amorphous layer or in the initial substrate, depending on the thickness of the amorphous layer. The assembly step with the second substrate and the heat treatment step can then be carried out to create a metallic compound up to and beyond the interface, Ni$_2$Si silicide in the example. The substrate surface 2 can also be amorphised by implantation using techniques known to those skilled in the art, for example by hydrogen implantation. This implantation may be local or global over the entire surface of the substrate. It may be done before or after implantation of metallic species according to the invention, this implantation of metallic species possibly also participating in all or some of this amorphisation step.

Example 3

One variant of example 2 consists of implanting the Ni$^+$ species at a dose of $2 \times 10^{17}$ ions/cm$^2$ and an energy of 10 keV. According to the SRIM-2000 simulation software, the implantation Rp is at a depth of about 13 nm. The silicon is etched, for example with an SC1 type chemical solution, until the implantation RP is close to the interface (FIG. 2B), so as to bring the implantation Rp close to the surface. The next step is an argon plasma treatment before bonding to reinforce the molecular bonding energy at low temperature. Once bonded, the structure is annealed at the temperature at which the silicide is formed so as to form the Ni2Si silicide, which will be formed up to and beyond the bonding interface (FIG. 1C).

Example 4

Ni$^+$ ions are implanted in two silicon wafers, each at a dose of $2 \times 10^{17}$ ions/cm$^2$ and an energy of 10 keV. According to the SRIM-2000 simulation software, the implantation Rp is at a depth of about 13 nm in each wafer. Each of the wafers is etched, for example using an SC1 type chemical solution, so as to bring the implantation Rp close to the surface of each wafer. The next step is to bond the two wafers to each other. This is followed by a siliciding annealing at about 750° C. so as to form the NiSi$_2$ silicide which will be formed at the bonding interface of the bonded wafers.

Example 5

Figure 4A:
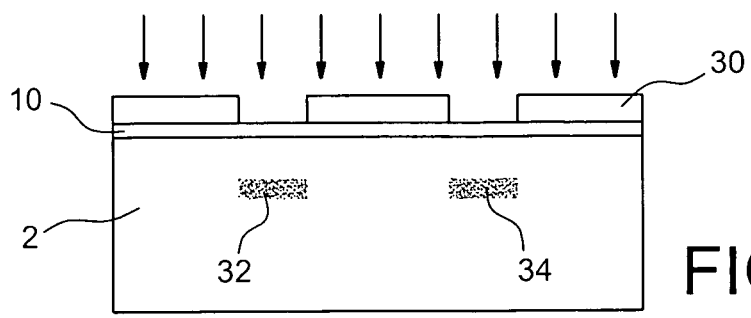
FIGS. 4A-6B show examples of the use of different processes according to the invention.

It is required to bond two wafers with a pure resistive local contact. Ni$^+$ ions are implanted in a silicon wafer covered by a silicon oxide layer 10 (5 nm thick) at a dose of $2 \times 10^{17}$ ions/cm$^2$ and an energy of 10 keV, through an implantation mask 30 (FIG. 4A). The result is thus a locally implanted substrate according to zones 32, 34. The implantation Rp according to the SRIM-2000 simulation software is at a depth of about 12 nm and is about 7 nm from the silicon surface.

Figure 4B:
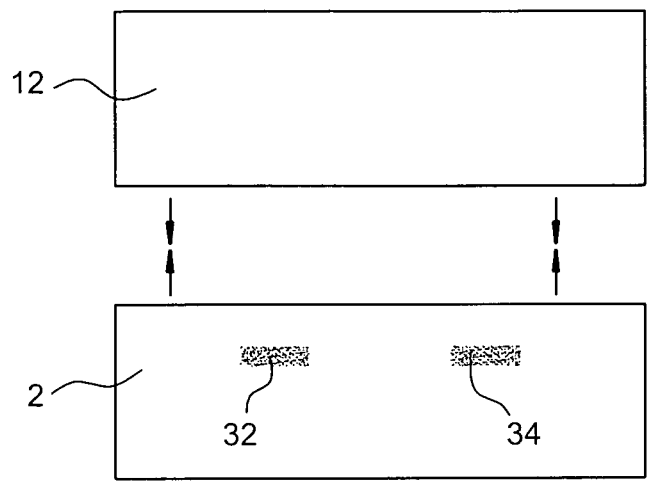
Figure 4C:
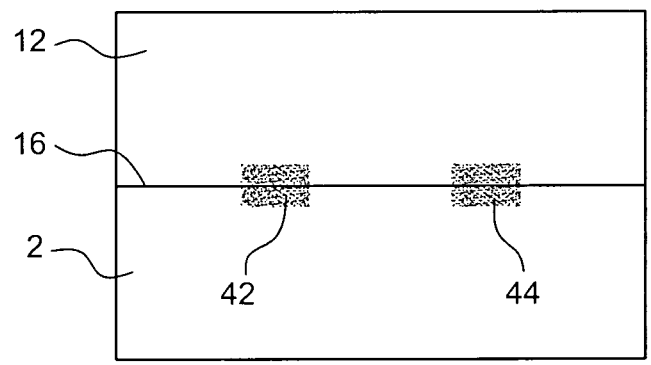

After implantation, the silicon oxide 10 is removed and a second implanted or non-implanted silicon wafer 12 is bonded directly (FIG. 4B). The next step is annealing at about 750° C. that will be used firstly to form the NiSi$_2$ silicide in two local zones 42, 44 and that will also be used to reinforce the silicon:silicon bonding at the other zones (FIG. 4C).

Figure 4D:
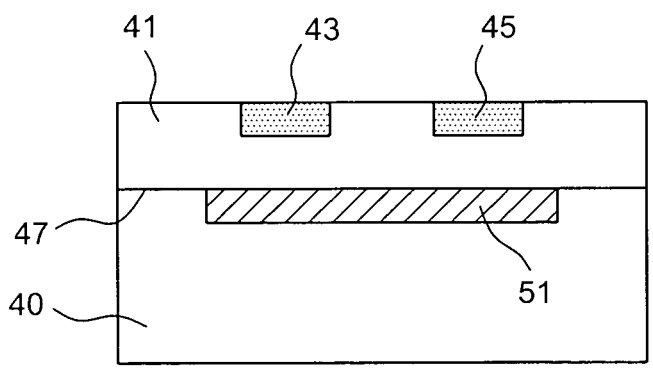

One particularly interesting structure resulting from the process that has just been described is illustrated in FIG. 4D. It is composed of a high resistivity silicon substrate 40 (for example obtained using the so-called floating zone technique for sorting by zone fusion) and a thin film 41 made of silicon comprising RF components 43, 45 (for example at the surface), the interface 47 between the substrate and the thin film locally comprising a metallic compound (for example made of nickel silicide) obtained by the process according to the invention, this metallic compound 51 acting as a ground plane. In this structure, the thin silicon film 41 may be derived from thinning of an SOI or a silicon substrate. The RF components 41, 43 may be made before and/or after the formation of the metallic compound depending on the compatibility of these processes (particularly related to their thermal budget aspects).

Example 6

Figure 5A:
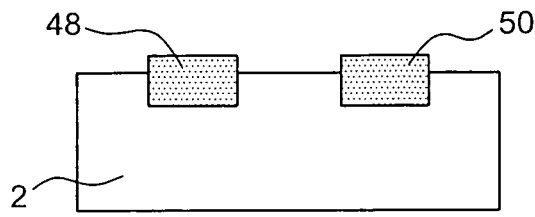
Figure 5B:
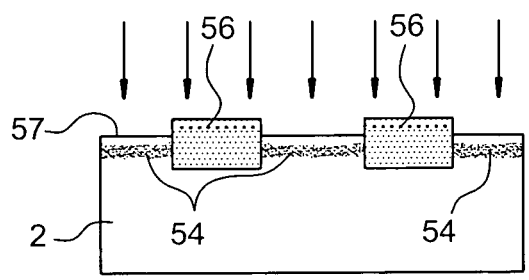
Figure 5C:
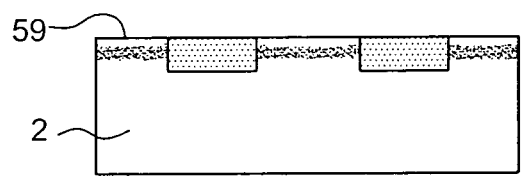

This example is a variant of example 5. The substrate 2 comprises local insulating zones 48, 50 on its surface, for example made of SiO$_2$ (see FIG. 5A). The next step is to implant Ni+ ions in this substrate at a dose of $2\times10^{17}$ ions/cm$^2$ and an energy of 10 keV (see FIG. 5B). The result is implanted zones 54, 56 for which the implantation Rp is at a depth of about 13 nm in the silicon (outside insulating zones) and above the silicon surface in the insulating zones 48, 50. The next step is to remove the portion of insulator that projects above the surface 57 of silicon, and possibly part of the silicon outside the insulating zones (see FIG. 5C), for example by mechanical-chemical polishing. The result is thus a plane surface 59 that can be bonded by molecular bonding to another wafer 52, for example a silicon on insulator (SOI) wafer (see FIG. 5D). The next step is a siliciding annealing at about 750° C., so as to form the NiSi$_2$ silicide 62 that will be formed close to the bonding interface and will reinforce bonding outside siliciding zones 48, 50. The next step is to eliminate the silicon 51 (back face) from the SOI wafer 52, up to the silicon oxide 55. As a variant, if the wafer 52 is made of solid or is a wafer of bulk silicon, this wafer will be thinned using conventional techniques described above. The result in both cases is a thin film 61, partly on the insulator 48, 50 and partly on the conducting zones 62 (see FIG. 5E). Therefore this embodiment can be used to obtain a locally conducting interface.

Example 7

Figure 5D:
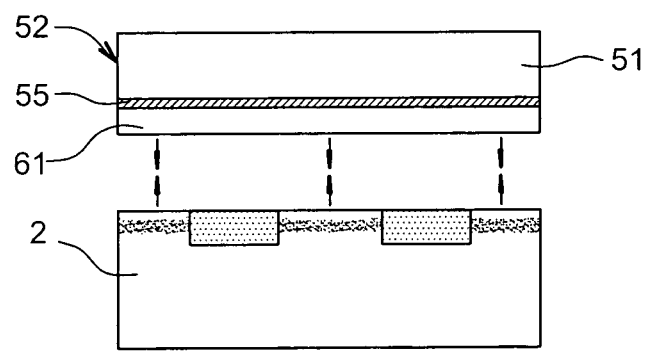
Figure 5E:
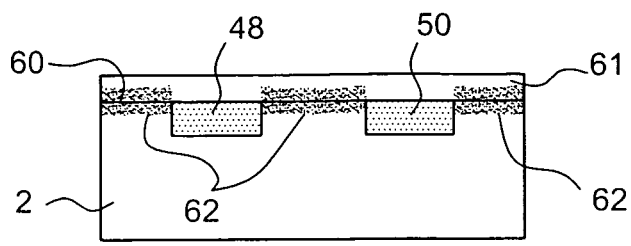

This example is a variant of example 6. An SOI wafer 52 comprising circuits already made in or on the layer 61 is assembled with an implanted wafer 2, comprising local insulating zones (FIG. 5D). In this case, the face facing the implanted silicon wafer 2 is a processed film 61, for example a circuits layer, for example covered by amorphous silicon deposited for example by sputtering. The silicon layer 61 with its layer of circuits may also have been transferred firstly onto an intermediate handle layer, this layer then being used for a second transfer onto the wafer 2: in this case, the facing face of the wafer 2 made of implanted silicon is the silicon layer 61, with its circuits layer above it. The next step is a siliciding annealing at about 750° C. to form the silicide NiSi$_2$, that will be formed close to the bonding interface. This heat treatment also reinforces bonding outside the siliciding zones. The next step is to eliminate the silicon 51 (back face) from the SOI wafer 52 and the silicon oxide 55. The result (FIG. 5E) is a processed thin film 61, partly on the insulator 48, 50 and partly on the conducting zones 62. Similarly, a debondable heterostructure could be used instead of the SOI wafer 52.

Example 8

This is a variant of the two examples 6 and 7. It consists of bonding a wafer 72 (FIG. 6A) prepared to be able to detach a surface layer 71 (processed or not) from a substrate 73, for example using the substrate fracturing technique such as the smart-cut method or for example a technique using a stop layer 75 in the structure, instead of an SOI. This stop layer may be epitaxial in nature (SiGe, doped Si, etc.) or it may be porous (porous Si, etc.) or amorphous (SiN4, etc.).

Figure 6A:
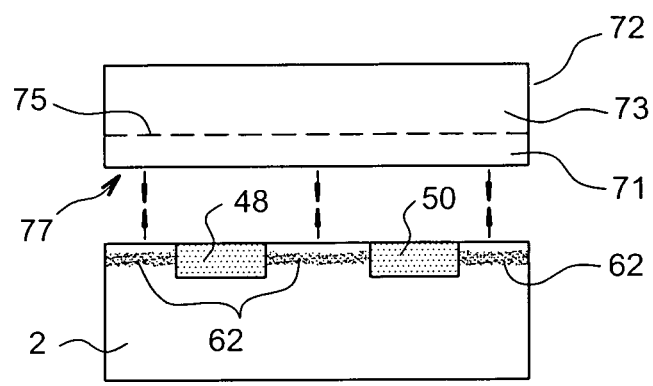
Figure 6B:
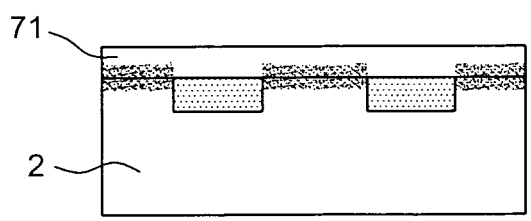

After assembly, annealing and fracture of the wafer 71, the result is the structure in FIG. 6B.

Preparation of the wafer 72 to detach a surface layer from it may comprise an atomic or ionic implantation, for example of helium or hydrogen ions, forming a weakening thin layer 75 that extends approximately parallel to a surface 77 of the substrate 73 (FIG. 6A). It thus forms a layer or a weakening plane or a fracture plane 75.

The fracture can then be made using the smart-cut technique, an example of which is described in the article by A. J. Auberton-Hervé et al. <<Why Can Smart-Cut Change the Future of Microelectronics?>> published in the International Journal of High Speed Electronics and Systems, Vol. 10, N° 1 (2000), p. 131-146.

Other methods may be used to form a weakening plane, for example by the formation of a porous silicon layer like that described in the article by K. Sataguchi et al. <<ELTRAN® by Splitting Porous Si layers>>, Proceedings of the 9th International Symposium on Silicon-on-Insulator Tech. and Device, 99-3, The Electrochemical Society, Seattle, p. 117-121 (1999).

Example 9

Figure 2B:
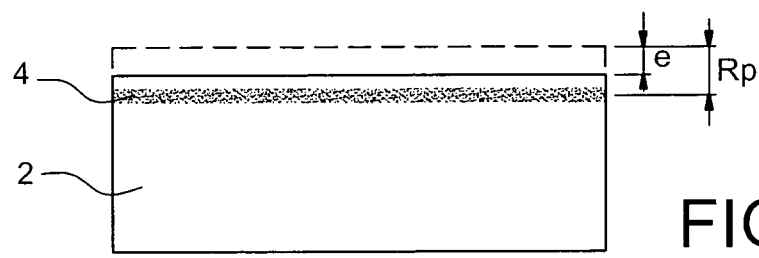

Pd+ ions are implanted in a silicon wafer at a dose of $2\times10^{17}$ ions/cm$^2$ and an energy of 10 keV according to one of the techniques described above (for example see FIG. 2A). The implantation Rp is at a depth of about 13 nm. The silicon is etched, for example with a chemical SC1 type solution until the implantation Rp is close to the surface (FIG. 2B). The next step is to directly bond a second silicon wafer (FIG. 1B). The next step is siliciding annealing at about 200° C. so as to form the Pd$_2$Si silicide close to the bonding interface (FIG. 1C). The advantage of the technique is that the silicon-silicon bonding reinforcement temperature can be lowered to the siliciding temperature (in this case 200° C.), while a heat treatment would normally have to be done at a temperature of more than 500° C.

Example 10

The invention can be used in substrates made of different materials. For example, the following procedure could be used to assemble a silicon wafer with a GaAs wafer according to the invention: Pd+ ions are implanted at least in one of the wafers, for example in the silicon wafer at a dose of the order of $3\times10^{17}$/cm$^2$. The next step is assembly of two wafers by molecular bonding followed by annealing, typically at about 200° C. The next step is to provoke the formation of Pd$_2$Si in the silicon and Pd₄GaAs in the GaAs wafer. These two metallic compounds are then sealed according to the invention.

Other metallic elements, also with a relatively low formation temperature of a conducting compound (originating from the alloys with the substrate material) could be selected for example using reference tables already mentioned above.

The invention can be used with two implanted substrates, for example according to one of the techniques described above with reference to FIGS. 1A-3. The assembled substrates may be made of different materials with implantations of different species, and the same substrate may be implanted with different species.

The techniques mentioned above such as substrate assembly techniques, substrate fracturing techniques and SOI components are described in the book by S. S. Iyer et al. <<Silicon Wafer Bonding Technology>> INSPEC, 2002.

The invention claimed is:

1. A method of sealing a first wafer and a second wafer each made of semiconducting materials, comprising:
    implanting a metallic species in at least the first wafer at a dose above $10^{16}$ species/cm²,
    assembling the first wafer and the second wafer by molecular bonding, and
    after the molecular bonding, forming a metallic ohmic contact including alloys formed between the implanted metallic species and the semiconducting materials of the first wafer and the second wafer, said metallic ohmic contact being formed at an assembly interface between the first wafer and the second wafer,
    wherein the forming includes causing the implanted metallic species to diffuse towards the interface between the first wafer with the second wafer and beyond the interface.

2. The method according to claim 1, wherein the forming includes applying a heat treatment at a temperature equal at least to a formation temperature of the said alloys.

3. The method according to claim 1, wherein the implanting includes implanting the metallic species at a depth of between 5 nm and 20 nm under a surface of the first wafer.

4. The method according to claim 1, further comprising:
    processing the first wafer to make all or part of a surface layer of the first wafer amorphous.

5. The method according to claim 4, wherein the processing includes depositing an amorphous material layer before and/or after implantation of the metallic species.

6. The method according to claim 4, wherein the processing includes implanting hydrogen.

7. The method according to claim 1, wherein the first wafer and the second wafer are made from a material chosen from among silicon, gallium arsenide (GaAs), SiC (silicon carbide), InP (Indium phosphide), Germanium (Ge), or silicon-Germanium (SiGe).

8. The method according to claim 1, wherein the implanted species includes one or more of Nickel, palladium, Cobalt, Platinum, Tantalum, Tungsten, Titanium, or Copper.

9. The method according to claim 1, wherein at least one of the wafers is a heterostructure.

10. The method according to claim 1, further comprising:
    thinning at least one of the wafers after the assembling or after the forming of the metallic ohmic contact.

11. The method according to claim 1, wherein at least one of the wafers is a debondable structure.

12. The method according to claim 1, wherein at least one of the wafers includes a weakening plane.

13. The method according to claim 12, further comprising:
    thinning the wafer by fracture along said weakening plane, after the assembling or after the forming of the metallic ohmic contact.

14. The method according to claim 1, wherein at least one of the wafers includes at least one circuit or circuit layer.

15. The method according to claim 1, wherein the implanting includes using a mask to obtain local implantation zones.

16. The method according to claim 1, further comprising:
    forming an insulating layer on the first wafer, before the implanting.

17. The method according to claim 1, further comprising:
    thinning the first wafer after implantation of the metallic species.

18. The method according to claim 1, wherein the first wafer includes at least one insulating zone located at a surface so as to obtain local implantation zones.

19. A structure obtained by the method of claim 1, wherein the metallic ohmic contact includes at least one metal chosen from among nickel, palladium, cobalt, platinum, tantalum, titanium, or copper.

20. The structure according to claim 19, wherein the semiconducting materials are selected from among Si, GaAs, SiC, InP, or SiGe.

21. The structure according to claim 19, wherein at least one of the substrates is a heterostructure.

22. The structure according to claim 19, wherein at least one of the substrates is a thin film.

23. The structure according to claim 19, wherein at least one of the substrates includes one or more of electronic, optical, or mechanical components.

24. The structure according to claim 19, wherein one of the substrates is a thin film made of silicon comprising RF circuits.

25. The structure according to claim 24, wherein the other substrate is made of high resistivity silicon.

26. A method of sealing a first wafer and a second wafer each made of semiconducting materials, comprising:
    implanting a metallic species in at least the first wafer, at a depth of between 5 nm and 20 nm under a surface of said first wafer, at a dose above $10^{16}$ species/cm²,
    assembling the first wafer and the second wafer by molecular bonding,
    after the molecular bonding, forming a metallic ohmic contact including alloys formed between the implanted metallic species and the semiconducting materials of the first wafer and the second wafer, said metallic ohmic contact being disposed at an assembly interface between the first wafer and the second wafer,
    wherein the forming includes causing the implanted metallic species to diffuse towards the interface between the first wafer with the second wafer and beyond the interface.

27. The method according to claim 26, wherein the forming includes applying a heat treatment at a temperature equal at least to a formation temperature of the said metallic compounds.

28. The method according to claim 26, further comprising:
    processing the first wafer to make all or part of a surface layer of the first wafer amorphous.

29. The method according to claim 28, wherein the processing further comprises depositing an amorphous material layer before and/or after implantation of the metallic species.

30. The method according to claim 28, wherein the processing includes implanting hydrogen.

31. A method of sealing a first wafer and a second wafer each made of semiconducting materials, comprising:

implanting a metallic species in at least the first wafer at a dose above $10^{16}$ species/cm$^2$, assembling the first wafer and the second wafer by molecular bonding, wherein the first wafer and the second wafer include silicon, and after the molecular bonding, forming a metallic ohmic contact including a silicide alloy formed between the implanted metallic species and the semiconducting materials of the first wafer and the second wafer, said metallic ohmic contact being formed at an assembly interface between the first wafer and the second wafer, wherein the forming includes causing the implanted metallic species to diffuse towards the interface between the first wafer with the second wafer and beyond the interface.

* * * * *